(12) United States Patent
Lee et al.

(10) Patent No.: US 7,495,518 B1
(45) Date of Patent: Feb. 24, 2009

(54) AUTOMATIC RADIO FREQUENCY FEEDBACK CALIBRATION CIRCUIT

(75) Inventors: Wayne S. Lee, San Mateo, CA (US); Kan G. Hoy, Fremont, CA (US)

(73) Assignee: Matsushita Electric Industrial, Osaka (JP)

( * ) Notice: Subject to any disclaimer, the term of this patent is extended or adjusted under 35 U.S.C. 154(b) by 45 days.

(21) Appl. No.: 11/825,442

(22) Filed: Jul. 5, 2007

(51) Int. Cl.
*H03L 7/06* (2006.01)
*H03L 7/18* (2006.01)

(52) U.S. Cl. .............................. 331/16; 331/18; 331/44; 327/158

(58) Field of Classification Search ............. 331/16–18, 331/25, 44; 327/156–159; 332/127; 375/376; 455/260
See application file for complete search history.

(56) References Cited

U.S. PATENT DOCUMENTS 6,873,213 B2 * 3/2005 Tsuda et al. ................. 331/1 A
7,274,231 B1 * 9/2007 Gillespie et al. ............ 327/158

* cited by examiner

*Primary Examiner*—David Mis
(74) *Attorney, Agent, or Firm*—Haverstock & Owens LLP

(57) ABSTRACT

A calibration circuit is configured to provide automatic feedback calibration during a tuning cycle. Automating the calibration process reduces the engineering evaluation time and mass production test time. The calibration settings vary as a function of frequency, and the calibration circuit automatically determines the proper calibration for any frequency application. The calibration circuit enhances communication performance by comparing and computing a time difference between a reference path and a feedback path. The calibration circuit is configured as part of a phase modulation path within a modulation circuit. The calibration circuit provides for calibration without prior knowledge of the system and reduced factory test time. The calibration circuit provides numerous advantages, including, but not limited to, accurate system results for time, frequency, temperature, and process variations with each calibration, or tuning.

22 Claims, 3 Drawing Sheets

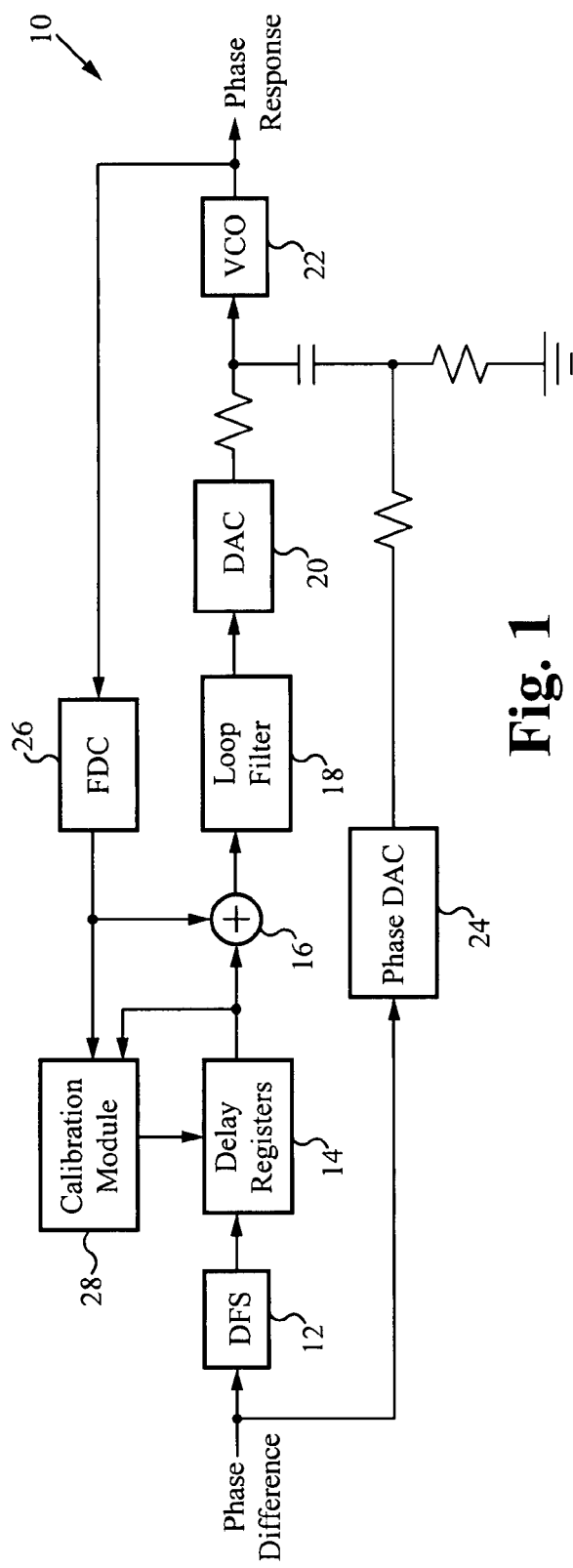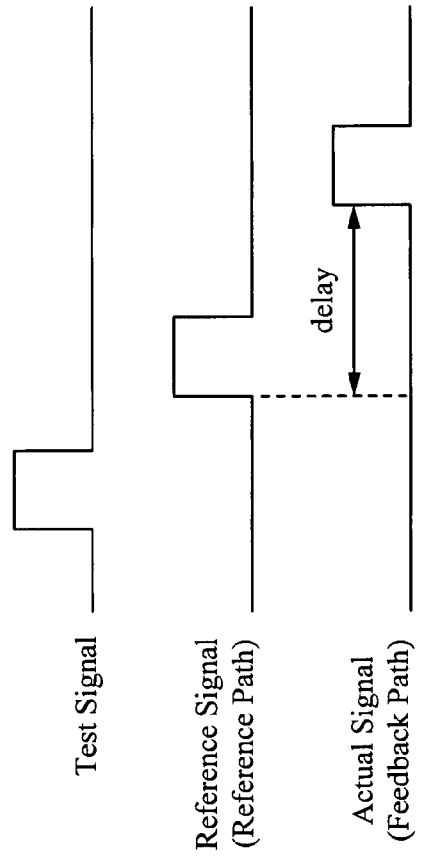

AUTOMATIC RADIO FREQUENCY FEEDBACK CALIBRATION CIRCUIT

FIELD OF THE INVENTION

The present invention relates to radio frequency modulation. More particularly, the present invention relates to a radio frequency modulator configured for automatic calibration.

BACKGROUND OF THE INVENTION

Many modulation circuits include a modulation reference path and a feedback path from a data sampler. The modulated signals output from both the modulation reference path and the feedback path need to be aligned in time, or phase, for optimal system performance. Conventionally, the calibration process used to perform the alignment has been performed manually. Manual alignment takes time to determine the correct setting from a default setting, especially for mass production applications. Many manual alignment processes simply use a trial and error approach for determining the correct calibration settings, further increasing the time needed to perform the calibration process.

Modulation paths are tuned to different frequencies depending on the application and system components. In the digital domain, the digital components operate according to a clock frequency and any time delays introduced by the digital components are consistent, regardless of frequency. However, in the analog domain, as a signal is modulated by analog components, a time delay introduced by the analog components varies with frequency. So the actual time delay in the analog domain is dependent on the actual wavelength of the signal being modulated. As a result, determining the calibration settings to fit all frequencies is often ineffective, since the frequency of the signal is a parameter of the system.

SUMMARY OF THE INVENTION

A calibration circuit is configured to provide automatic feedback calibration during a tuning cycle. Automating the calibration process reduces the engineering evaluation time and mass production test time. The calibration settings vary as a function of frequency, and the calibration circuit automatically determines the proper calibration for any frequency application. The calibration circuit enhances communication performance by comparing and computing a time difference between a reference path and a feedback path. The calibration circuit is configured as part of a phase modulation path within a modulation circuit. In some embodiments, the modulation circuit is a radio frequency (RF) modulation circuit, such as the type used in wireless communications network. Alternatively, the calibration circuit is configured as part of any circuit that experiences timing, or phase, delays due to circuit components. The calibration circuit provides for calibration without prior knowledge of the system and reduced factory test time. The calibration circuit provides numerous advantages, including, but not limited to, accurate system results for time, frequency, temperature, and process variations with each calibration, or tuning.

In one aspect, a phase modulation circuit includes a first signal path configured to generate a first digital signal in response to a digital test signal, wherein the first signal path includes a digital frequency synthesizer, and a second signal path configured to generate a second digital signal in response to the digital signal, wherein the second signal path includes a voltage controlled oscillator and a frequency-to-digital converter. The first signal path has a first port to be used for measuring the first digital signal, and the second signal path has a second port to be used for measuring the second digital signal, wherein at least one of the first signal path and the second signal path has a delay circuit, wherein a timing delay value prepared by the delay circuit is determined based on signals which are measured through the first port and the second port. The phase modulation circuit further comprises a phase locked loop including the voltage controlled oscillator and a comparator, wherein the comparator is coupled to the first signal path to receive the first digital signal and the comparator is coupled to the second signal path to receive the second digital signal, the comparator is configured to output a digital error signal representative of a phase difference between the first digital signal and the second digital signal, further wherein the voltage controlled oscillator is configured to output an analog phase response according to a tuning voltage adjusted by the digital error signal output from the comparator.

In another aspect, an automatically calibrated phase modulating circuit includes a first signal path configured to generate a first digital signal with optimized timing characteristics in response to a digital test signal, a second signal path configured to generate a second digital signal that includes a circuit timing delay associated with phase modulating a signal, wherein the second signal path includes one or more delay registers configured to add a timing delay to the second digital signal, and a calibration module coupled to the first signal path and the second signal path, wherein the calibration module is configured to determine a phase difference between the first digital signal and the second digital signal, to determine the timing delay to compensate for the phase difference, and to provide the timing delay to the one or more delay registers thereby matching a phase of the second digital signal to a phase of the first digital signal. The first digital signal can be a first digital phase modulated signal, and the second digital signal can be a second digital phase modulated signal. The digital test signal can be a digital pulse signal. The digital test signal can be a digital phase difference signal. The first signal path can include a digital frequency synthesizer. The second signal path can include a digital-to-analog converter, a voltage controlled oscillator, and a frequency-to-digital converter. The voltage controlled oscillator can be configured to output a phase response of the circuit. The circuit can also include a phase locked loop including a voltage controlled oscillator and a comparator, wherein the comparator is coupled to the first signal path to receive the first digital signal and the comparator is coupled to the second signal path to receive the second digital signal, the comparator is configured to output a digital error signal representative of a phase difference between the first digital signal and the second digital signal, further wherein the voltage controlled oscillator is configured to output an analog phase response according to a tuning voltage adjusted by the digital error signal output from the comparator. The phase locked loop can also include a loop filter, a digital-to-analog converter, and a frequency-to-digital converter, wherein an input of the loop filter is coupled to an output of the comparator, an output of the loop filter is coupled to an input of the digital-to-analog converter, an output of the digital-to-analog converter is coupled to an input of the voltage controlled oscillator, an output of the voltage controlled oscillator is coupled to an input of the frequency-to-digital converter, and an output of the frequency-to-digital converter is coupled to an input of the comparator. Alternatively, the phase locked loop can also include a loop filter, a digital-to-analog converter, a frequency-to-digital converter, and the one or more delay registers, wherein an input of the loop filter is coupled to an output of the comparator, an output of the loop filter is coupled to an input of the digital-to-analog converter, an output of the digital-to-analog converter is coupled to an input of the voltage controlled oscillator, an output of the voltage controlled oscillator is coupled to an input of the frequency-to-digital converter, an output of the frequency-to-digital converter is coupled to an input of the one or more delay registers, and an output of the one or more delay registers is coupled to an input of the comparator. The timing delay can be a positive value or a negative value. The first signal path can be a radio frequency modulation reference path. The second signal path can be a radio frequency feedback path.

In yet another aspect, an automatically calibrated phase modulating circuit includes a first signal path configured to receive a digital test signal and to generate a reference digital signal with optimized timing characteristics, wherein the first signal path includes one or more delay registers configured to add a timing delay to the reference digital signal, a second signal path configured to generate a modulated digital signal that includes a system timing delay associated with phase modulating a signal, a phase locked loop including a voltage controlled oscillator and a comparator, wherein the comparator is coupled to the first signal path to receive the reference digital signal and the comparator is coupled to the second signal path to receive the modulated digital signal, the comparator is configured to output a digital error signal representative of a phase difference between the reference digital signal and the modulated digital signal, further wherein the phase locked loop is configured to output an analog phase response according to a tuning voltage adjusted by the digital error signal output from the comparator, and a calibration module coupled to the first signal path and the second signal path, wherein the calibration module is configured to determine a phase difference between the reference digital signal and the modulated digital signal, to determine the timing delay to compensate for the phase difference, and to provide the timing delay to the one or more delay registers thereby matching a phase of the modulated digital signal to a phase of the reference digital signal. The phase locked loop can also include a loop filter, a digital-to-analog converter, and a frequency-to-digital converter, wherein an input of the loop filter is coupled to an output of the comparator, an output of the loop filter is coupled to an input of the digital-to-analog converter, an output of the digital-to-analog converter is coupled to an input of the voltage controlled oscillator, an output of the voltage controlled oscillator is coupled to an input of the frequency-to-digital converter, and an output of the frequency-to-digital converter is coupled to an input of the comparator.

In another aspect, an automatically calibrated phase modulating circuit includes a digital frequency synthesizer configured to receive a digital test signal, one or more delay registers coupled to an output of the digital frequency synthesizer, wherein the delay registers are configured to delay the digital test signal for a specific period of time, thereby outputting a delayed digital test signal, a first digital-to-analog converter configured to receive the digital test signal and to output a first analog signal, a voltage controlled oscillator coupled to an output of the first digital-to-analog converter, wherein the voltage controlled oscillator is configured to input the first analog signal to output a second analog signal, a feedback loop coupled to the output of the voltage controlled oscillator, wherein the feedback loop includes a frequency-to-digital converter to convert the second analog signal output from the voltage controlled oscillator to a third digital signal, a comparator coupled to the frequency-to-digital converter and to the one or more delay registers, wherein the comparator is configured to output a digital error signal that represents a phase difference between the delayed digital test signal and the third digital signal, and a calibration module coupled to the frequency-to-digital converter and to the one or more delay registers, wherein the calibration module is configured to input the delayed digital signal from the one or more delay registers and the third digital signal from frequency-to-digital converter, and to output a calibration signal to the one or more delay registers, wherein the calibration module is further configured to determine a time delay between the third digital signal and the delayed digital signal, and to generate the calibration signal according to the determined time delay such that the delayed digital signal is phase-aligned with the third digital signal. The circuit can also include a loop filter coupled to the calibration module and a second digital-to-analog converter coupled to an output of the loop filter, wherein the output of the second digital-to-analog converter is coupled to the output of the first digital-to-analog converter as input of the voltage controlled oscillator. The voltage controlled oscillator, the frequency-to-digital converter, the comparator, the loop filter, and the second digital-to-analog converter can form a phase locked loop, wherein the voltage controlled oscillator can be configured to output an analog phase response according to a tuning voltage adjusted by the digital error signal output from the comparator.

In a further aspect, a method of phase modulation comprises generating a first digital signal within a first signal path in response to a digital test signal, wherein the first signal path includes a digital frequency synthesizer, generating a second digital signal within a second signal path in response to the digital signal, wherein the second signal path includes a voltage controlled oscillator and a frequency-to-digital converter, wherein the first signal path has a first port to be used for measuring the first digital signal, and the second signal path has a second port to be used for measuring the second digital signal, and determining a timing delay value prepared by a delay circuit based on signals which are measured through the first port and the second port, wherein at least one of the first path and the second path has the delay circuit.

BRIEF DESCRIPTION OF THE SEVERAL VIEWS OF THE DRAWINGS

FIG. 1 illustrates an exemplary block diagram of a first embodiment of a calibration circuit.

FIG. 2 illustrates an exemplary timing diagram corresponding to the calibration circuit of FIG. 1.

The present invention is described relative to the several views of the drawings. Where appropriate and only where identical elements are disclosed and shown in more than one drawing, the same reference numeral will be used to represent such identical elements.

DETAILED DESCRIPTION

Figure 3:
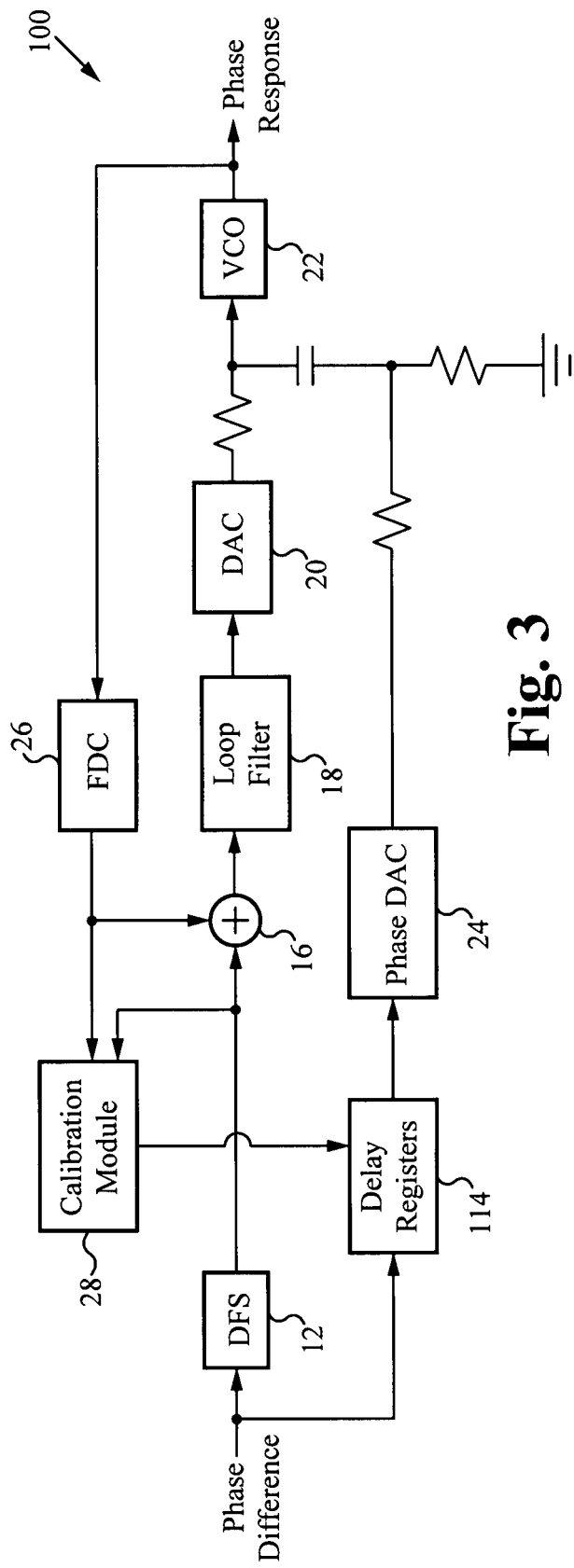
FIG. 3 illustrates an exemplary block diagram of a second embodiment of a calibration circuit.

Embodiments of the present invention are directed to an automatic RF calibration circuit. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 1 illustrates an exemplary block diagram of a first embodiment of a calibration circuit. In some embodiments, the calibration circuit is used for radio frequency (RF) applications, in which case the calibration circuit is a RF calibration circuit. The calibration circuit 10 includes a digital frequency synthesizer (DFS) 12, one or more delay registers 14, a comparator 16, a loop filter 18, a digital-to-analog converter (DAC) 20, a voltage controlled oscillator (VCO) 22, a phase digital-to-analog converter (DAC) 24, a frequency-to-digital converter (FDC) 26, and a calibration module 28. In some embodiments, the DAC 20 is a sigma-delta DAC, the phase DAC 24 is a 10-bit phase DAC, and the FDC 26 is a sigma-delta FDC. The calibration circuit 10 is configured as part of a phase modulation path. The calibration circuit 10 is configured to compensate for component timing delays that occur within the phase modulation. The output of the calibration circuit 10 is a phase response of the phase modulation path, where the phase response is compensated for unwanted path timing delays. To compensate for the path timing delays, the calibration circuit 10 is initially calibrated on start-up according to a test signal. During subsequent operation, a modulated phase difference signal is received by the calibration circuit 10 and the received signal is compensated according to a timing delay determined during initial calibration.

To perform the calibration routine, a test signal is input to the phase modulation path and received as a time delayed digital test signal, referred to as the actual signal, by the calibration circuit 10. The received actual signal is input to both the DFS 12 and the phase DAC 24. The phase DAC 24, the VCO 22, and the FDC 26 form a feedback path that outputs a digital representation of the actual signal input to the calibration circuit 10. This digital actual signal is output from the FDC 26 and input to both the comparator 16 and the calibration module 28.

The DFS 12 and the delay registers 14 form a reference path that outputs a digital signal representative of an optimally timed digital test signal, that is the digital test signal without the phase path timing delays. The optimally timed digital test signal is referred to as a reference signal. The DFS 12 receives the actual signal and generates an internal representation of the corresponding frequency. The DFS 12 also receives as input a constant value signal (not shown). The constant value signal represents a center frequency at which the VCO is to be operated. The DFS 12 sums the actual signal with the constant value signal to generate a digital representation of modulation on top of the center frequency. The resultant signal represents the reference signal. The delay registers 14 are configured to time delay an input signal by a set period of time, referred to as a timing delay. The timing delay is initially set to zero. Alternatively, other default values are used. The reference signal is output from the delay registers 14 and input to the comparator 16 and the calibration module 28. The calibration module 28 compares the actual signal received from the FDC 26 to the reference signal received from the delay registers 14 in order to determine the timing delay between the two signals.

FIG. 2 illustrates an exemplary timing diagram corresponding to the calibration circuit of FIG. 1. In some embodiments, the test signal input into the phase modulation path is a test pulse, such as that shown in FIG. 2. In response to the test signal, the actual signal received by the calibration module 28 (FIG. 1) from the feedback path is delayed as compared to the reference signal received by the calibration module 28 from the reference path. The timing diagram shown in FIG. 2 shows a single test pulse. Alternatively, multiple test pulses can be applied, and the resulting timing delay is determined for each test pulse. In this case, a statistical measure, such as the average or the mean, can be applied to all of the determined timing delays to determine a consensus timing delay, which is then applied to the delay registers.

Referring again to FIG. 1, the determined timing delay is sent from the calibration module 28 to the delay registers 14. The delay registers 14 are set to the timing delay so as to time delay the signal output from the DFS 12 by the timing delay. Subsequently, the digital signal output from the delay registers 14 is in phase with the actual signal input to the calibration circuit 10. As a result, the output of the comparator 16, referred to as an error signal, is zero and the VCO 22 is tuned to a reference frequency. The VCO 22 is locked to the reference frequency by the phase locked loop formed by the VCO 22, the FDC 26, the comparator 16, the loop filter 18, and the DAC 20. After the calibration routine, subsequent operation results in operational variance of the VCO 22. Since the timing delays within the phase path are compensated by the calibration routine, any variance in the VCO 22 results in a non-zero error signal output from the comparator 16. The loop filter 18 and the DAC 20 compensate for this variance by adjusting the tuning voltage applied to the input of the VCO 22.

The output of the VCO 22 is the phase response, adjusted for timing delays, of the phase modulation path. During calibration, the calibration circuit 10 aligns the timing of the actual signal and the reference signal. The two signals are aligned by determining a proper timing delay to be implemented by the delay registers 14. After calibration, any error signal output from the comparator 16 is a result of the VCO 22 straying from the reference frequency, to which the VCO 22 was locked during calibration. Straying from the reference frequency is often a result of anomalies other than component timing delays introduced within the phase modulation path.

The calibration module 28 also includes a multi-state machine. The multi-state machine is configured to determine whether or not the actual signal and the reference signal are properly received by the calibration module 28. The multi-state machine is configured to account for error conditions in the calibration process. If one of the two signals is not properly received, the calibration module 28 initiates a reset and the calibration process is re-started. The calibration module 28 can be configured to perform any number of test iterations, for example multiple test signals are sent through the circuit and each resulting time delay is determined and compiled for a cumulative time delay result, and the multi-state machine can be expanded to account for this number. The multi-state machine can also be configured to re-set for any number of consecutive error conditions before a general error condition in the system is determined.

The calibration circuit 10 of FIG. 1 and the corresponding timing diagram of FIG. 2 are directed to a situation where the actual signal passing through the feedback path is time delayed relative to the reference path. In this case, the timing delay is determined and the reference signal passing through the reference path is correspondingly delayed by the delay registers 14 configured within the reference path. In alternative situations, the actual signal passing through the feedback path is instead faster than the reference signal passing through the reference path, in which case the reference signal passing through the reference path is time delayed relative to the actual signal passing through the feedback path. In this situation, the determined timing delay is to be applied within the feedback path.

FIG. 3 illustrates an exemplary block diagram of a second embodiment of a calibration circuit in which a timing delay is applied within a feedback path. The calibration circuit 100 functions similarly to the calibration circuit 10 of FIG. 1, with the exception that the delay registers are not configured within the reference path, as in the calibration circuit 10, but instead the delay registers 114 are configured within the feedback path of the calibration circuit 100. In this configuration, the actual signal received by the calibration circuit 100 is input to both the DFS 12 and the delay registers 114. The output of the delay registers 114 are input to the phase DAC 24. In the calibration circuit 100 shown in FIG. 3, the feedback path is configured such that the delay registers 114 are coupled to the input of the phase DAC 24. Alternatively, the delay registers 114 can be positioned anywhere within the feedback path.

Figure 4:
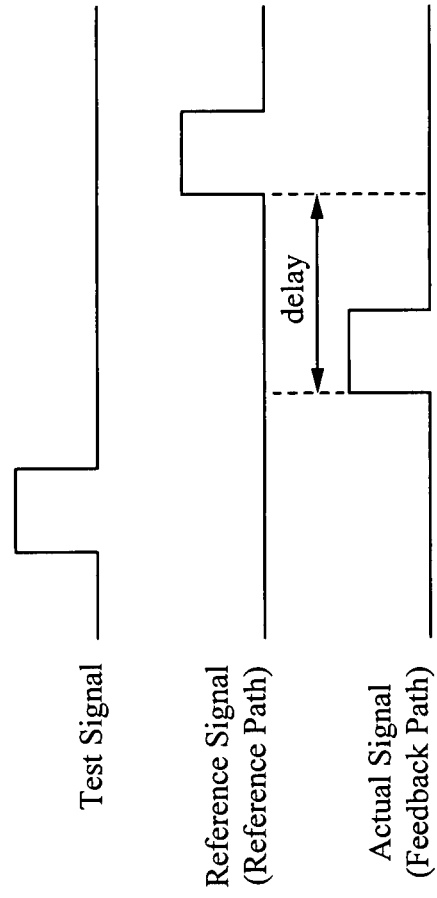
FIG. 4 illustrates an exemplary timing diagram corresponding to the calibration circuit of FIG. 3.

FIG. 4 illustrates an exemplary timing diagram corresponding to the calibration circuit 100 of FIG. 3. In response to the test signal, the reference signal received by the calibration module 28 (FIG. 3) from the reference path is delayed as compared to the actual signal received by the calibration module 28 from the feedback path. Although a single test pulse is shown in FIG. 2, multiple test pulses can be applied, and the resulting timing delay is determined for each test pulse using the statistical measure, as previously described.

Referring again to FIG. 3, the determined timing delay is sent from the calibration module 28 to the delay registers 114. The delay registers 114 are set to the timing delay so as to time delay the actual signal by the timing delay. Subsequently, the signal output from the delay registers 114 is in phase with the reference signal output from the DFS 12.

Figure 5:
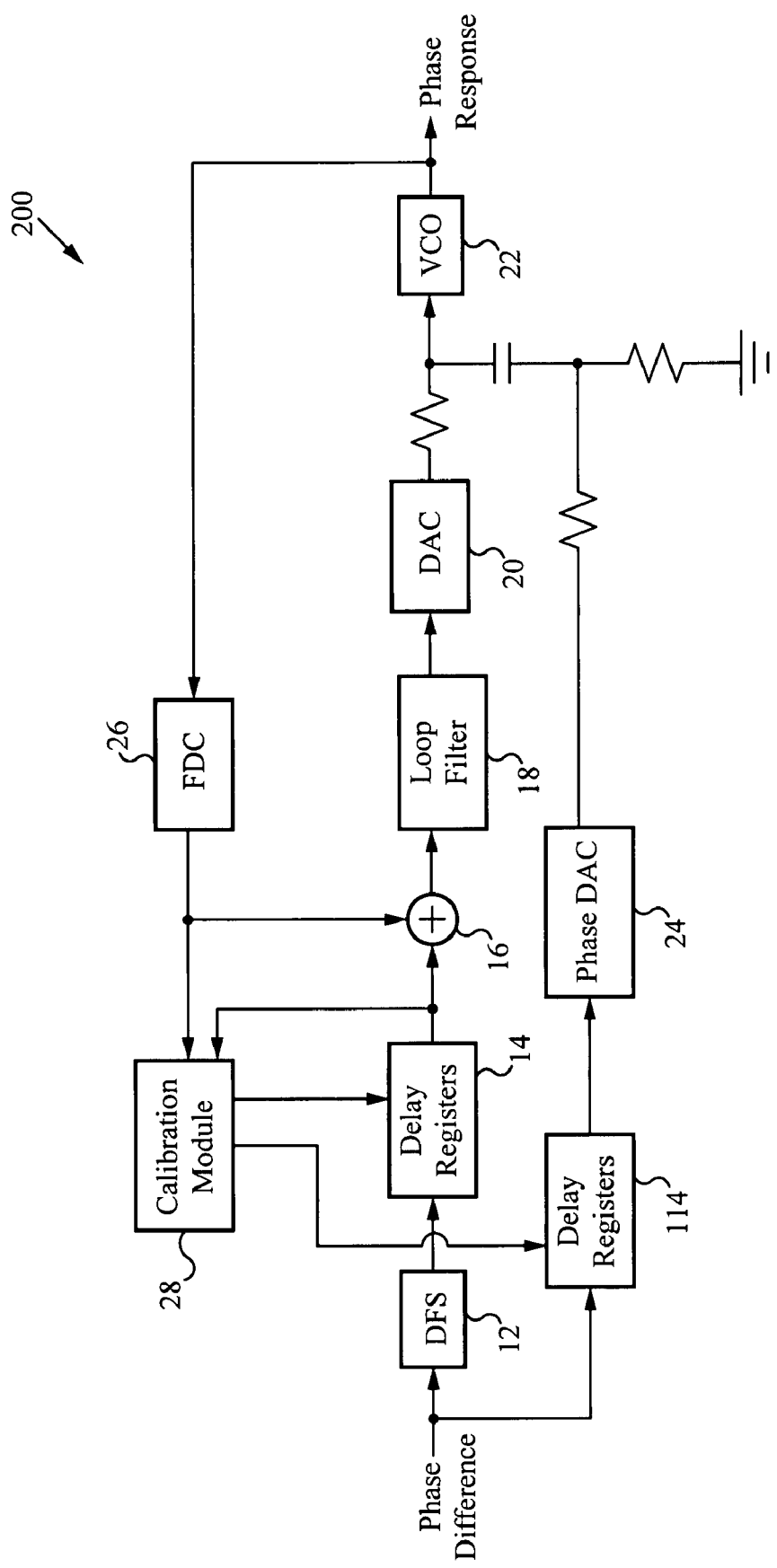
FIG. 5 illustrates an exemplary block diagram of a third embodiment of a calibration circuit.

In general, it may not be pre-established which path, either the reference path or the feedback path, is the slower path. To account for either condition, a calibration circuit is configured with delay registers in both the reference path and the feedback path. Such a configuration enables the timing delay to be applied to either path, depending on which path is faster. FIG. 5 illustrates an exemplary block diagram of a third embodiment of a calibration circuit 200 in which a timing delay is applied within a feedback path and a reference path. The calibration circuit 200 combines the configurations of the calibration circuit 10 (FIG. 1) and the calibration circuit 100 (FIG. 3), where the delay registers 14 are included in the reference path and the delay registers 114 are included in the feedback path. The calibration module 28 determines the timing delay as described above. If the actual signal from the feedback path is time delayed relative to the reference signal from the reference path, then the timing delay is sent from the calibration module 28 to the delay registers 14. The delay registers 14 are set to the timing delay. If the reference signal from the reference path is time delayed relative to the actual signal from the feedback path, then the timing delay is sent from the calibration module 28 to the delay registers 114. The delay registers 114 are set to the timing delay.

The calibration circuits above are described in terms of initially calibrating on start-up according to a test signal. Although the simpler the test signal waveform, the less complex it is to determine the timing delay, it is also contemplated that the calibration process is performed using an actual modulated signal during system operation as the calibration signal. This is referred to as a dynamic calibration. The resulting measured signals at the calibration module are more complex and require a more sophisticated comparison technique, but the general principle of determining the timing delay and correspondingly adjusting the delay registers still applies.

The components shown in FIGS. 1, 3, and 5 related to the reference path and the feedback path are for exemplary purposes only. Alternative configurations can include additional components, such as filters, at various positions within either path. Such additional filters further impact the timing delays, which are also compensated for during the calibration process.

The present application has been described in terms of specific embodiments incorporating details to facilitate the understanding of the principles of construction and operation of the power amplification circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

We claim:

1. A phase modulation circuit comprising:
   a. a first signal path configured to generate a first digital signal in response to a digital test signal, wherein the first signal path includes a digital frequency synthesizer; and
   b. a second signal path configured to generate a second digital signal in response to the digital signal, wherein the second signal path includes a voltage controlled oscillator and a frequency-to-digital converter;
   wherein the first signal path has a first port to be used for measuring the first digital signal, and the second signal path has a second port to be used for measuring the second digital signal,
   wherein at least one of the first signal path and the second signal path has a delay circuit, wherein a timing delay value prepared by the delay circuit is determined based on signals which are measured through the first port and the second port.

2. The circuit of claim 1 further comprising a phase locked loop including the voltage controlled oscillator and a comparator, wherein the comparator is coupled to the first signal path to receive the first digital signal and the comparator is coupled to the second signal path to receive the second digital signal, the comparator is configured to output a digital error signal representative of a phase difference between the first digital signal and the second digital signal, further wherein the voltage controlled oscillator is configured to output an analog phase response according to a tuning voltage adjusted by the digital error signal output from the comparator.

3. An automatically calibrated phase modulating circuit comprising:

a. a first signal path configured to generate a first digital signal with optimized timing characteristics in response to a digital test signal;

b. a second signal path configured to generate a second digital signal that includes a circuit timing delay associated with phase modulating a signal, wherein the second signal path includes one or more delay registers configured to add a timing delay to the second digital signal; and c. a calibration module coupled to the first signal path and the second signal path, wherein the calibration module is configured to determine a phase difference between the first digital signal and the second digital signal, to determine the timing delay to compensate for the phase difference, and to provide the timing delay to the one or more delay registers thereby matching a phase of the second digital signal to a phase of the first digital signal.

4. The circuit of claim 3 wherein the first digital signal comprises a first digital phase modulated signal, and the second digital signal comprises a second digital phase modulated signal.

5. The circuit of claim 3 wherein the digital test signal comprises a digital pulse signal.

6. The circuit of claim 3 wherein the digital test signal comprises a digital phase difference signal.

7. The circuit of claim 3 wherein the first signal path comprises a digital frequency synthesizer.

8. The circuit of claim 3 wherein the second signal path includes a digital-to-analog converter, a voltage controlled oscillator, and a frequency-to-digital converter.

9. The circuit of claim 8 wherein the voltage controlled oscillator is configured to output a phase response of the circuit.

10. The circuit of claim 3 further comprising a phase locked loop including a voltage controlled oscillator and a comparator, wherein the comparator is coupled to the first signal path to receive the first digital signal and the comparator is coupled to the second signal path to receive the second digital signal, the comparator is configured to output a digital error signal representative of a phase difference between the first digital signal and the second digital signal, further wherein the voltage controlled oscillator is configured to output an analog phase response according to a tuning voltage adjusted by the digital error signal output from the comparator.

11. The circuit of claim 10 wherein the phase locked loop further comprises a loop filter, a digital-to-analog converter, and a frequency-to-digital converter, wherein an input of the loop filter is coupled to an output of the comparator, an output of the loop filter is coupled to an input of the digital-to-analog converter, an output of the digital-to-analog converter is coupled to an input of the voltage controlled oscillator, an output of the voltage controlled oscillator is coupled to an input of the frequency-to-digital converter, and an output of the frequency-to-digital converter is coupled to an input of the comparator.

12. The circuit of claim 10 wherein the phase locked loop further comprises a loop filter, a digital-to-analog converter, a frequency-to-digital converter, and the one or more delay registers, wherein an input of the loop filter is coupled to an output of the comparator, an output of the loop filter is coupled to an input of the digital-to-analog converter, an output of the digital-to-analog converter is coupled to an input of the voltage controlled oscillator, an output of the voltage controlled oscillator is coupled to an input of the frequency-to-digital converter, an output of the frequency-to-digital converter is coupled to an input of the one or more delay registers, and an output of the one or more delay registers is coupled to an input of the comparator.

13. The circuit of claim 3 wherein the timing delay is a positive value.

14. The circuit of claim 3 wherein the timing delay is a negative value.

15. The circuit of claim 3 wherein the first signal path comprises a radio frequency modulation reference path.

16. The circuit of claim 3 wherein the second signal path comprises a radio frequency feedback path.

17. An automatically calibrated phase modulating circuit comprising:

a. a first signal path configured to receive a digital test signal and to generate a reference digital signal with optimized timing characteristics, wherein the first signal path includes one or more delay registers configured to add a timing delay to the reference digital signal;

b. a second signal path configured to generate a modulated digital signal that includes a system timing delay associated with phase modulating a signal;

c. a phase locked loop including a voltage controlled oscillator and a comparator, wherein the comparator is coupled to the first signal path to receive the reference digital signal and the comparator is coupled to the second signal path to receive the modulated digital signal, the comparator is configured to output a digital error signal representative of a phase difference between the reference digital signal and the modulated digital signal, further wherein the phase locked loop is configured to output an analog phase response according to a tuning voltage adjusted by the digital error signal output from the comparator; and d. a calibration module coupled to the first signal path and the second signal path, wherein the calibration module is configured to determine a phase difference between the reference digital signal and the modulated digital signal, to determine the timing delay to compensate for the phase difference, and to provide the timing delay to the one or more delay registers thereby matching a phase of the modulated digital signal to a phase of the reference digital signal.

18. The circuit of claim 17 wherein the phase locked loop further comprises a loop filter, a digital-to-analog converter, and a frequency-to-digital converter, wherein an input of the loop filter is coupled to an output of the comparator, an output of the loop filter is coupled to an input of the digital-to-analog converter, an output of the digital-to-analog converter is coupled to an input of the voltage controlled oscillator, an output of the voltage controlled oscillator is coupled to an input of the frequency-to-digital converter, and an output of the frequency-to-digital converter is coupled to an input of the comparator.

19. An automatically calibrated phase modulating circuit comprising:

a. a digital frequency synthesizer configured to receive a digital test signal;

b. one or more delay registers coupled to an output of the digital frequency synthesizer, wherein the delay registers are configured to delay the digital test signal for a specific period of time, thereby outputting a delayed digital test signal;

c. a first digital-to-analog converter configured to receive the digital test signal and to output a first analog signal;

d. a voltage controlled oscillator coupled to an output of the first digital-to-analog converter, wherein the voltage controlled oscillator is configured to input the first analog signal to output a second analog signal;

e. a feedback loop coupled to the output of the voltage controlled oscillator, wherein the feedback loop includes a frequency-to-digital converter to convert the second analog signal output from the voltage controlled oscillator to a third digital signal;

f. a comparator coupled to the frequency-to-digital converter and to the one or more delay registers, wherein the comparator is configured to output a digital error signal that represents a phase difference between the delayed digital test signal and the third digital signal; and g. a calibration module coupled to the frequency-to-digital converter and to the one or more delay registers, wherein the calibration module is configured to input the delayed digital signal from the one or more delay registers and the third digital signal from frequency-to-digital converter, and to output a calibration signal to the one or more delay registers;

wherein the calibration module is further configured to determine a time delay between the third digital signal and the delayed digital signal, and to generate the calibration signal according to the determined time delay such that the delayed digital signal is phase-aligned with the third digital signal.

20. The circuit of claim 19 further comprising a loop filter coupled to the calibration module and a second digital-to-analog converter coupled to an output of the loop filter, wherein the output of the second digital-to-analog converter is coupled to the output of the first digital-to-analog converter as input of the voltage controlled oscillator.

21. The circuit of claim 20 wherein the voltage controlled oscillator, the frequency-to-digital converter, the comparator, the loop filter, and the second digital-to-analog converter comprise a phase locked loop, wherein the voltage controlled oscillator is configured to output an analog phase response according to a tuning voltage adjusted by the digital error signal output from the comparator.

22. A method of phase modulation comprising:
  a. generating a first digital signal within a first signal path in response to a digital test signal, wherein the first signal path includes a digital frequency synthesizer;
  b. generating a second digital signal within a second signal path in response to the digital signal, wherein the second signal path includes a voltage controlled oscillator and a frequency-to-digital converter, wherein the first signal path has a first port to be used for measuring the first digital signal, and the second signal path has a second port to be used for measuring the second digital signal, and
  c. determining a timing delay value prepared by a delay circuit based on signals which are measured through the first port and the second port, wherein at least one of the first path and the second path has the delay circuit.

* * * * *